SEMICONDUCTOR DEVICE

Filed Aug. 18, 1965

INVENTORS
SHIGERU TSUJI
SHINZO ANAZAWA
BY Hopgood & Calimafde
ATTORNEYS

United States Patent Office 3,404,319

Patented Oct. 1, 1968

3,404,319

SEMICONDUCTOR DEVICE

Shigeru Tsuji and Shinzo Anazawa, Tokyo, Japan, assignors to Nippon Electric Company Limited, Tokyo, Japan, a corporation of Japan Filed Aug. 18, 1965, Ser. No. 480,642
Claims priority, application Japan, Aug. 21, 1964, 39/47,636
5 Claims. (Cl. 317—234)

ABSTRACT OF THE DISCLOSURE

A semiconductor device including a base of insulating material, a semiconductor element mounted on the base, a plurality of ribbon leads pressed into the base material and generally flush with the surface thereof, and a cover sealed to the base and the leads by means of a low melting point glass, to provide a hermetically sealed enclosure.

This invention relates to semiconductor devices, and more particularly to such devices having a semiconductor element hermetically sealed therein.

Although a number of semiconductor device structures with semiconductor elements such as transistors and diodes sealed therein have been used, there has been a strong demand for a semiconductor device having light weight and small size, due to the rapid expansion of the number of applications in the field of electronics. As a result, there is a need for a hermetically sealed semiconductor device which has a simple structure capable of being manufactured by simple processes and which is light in weight, small in size, and which is mechanically strong so as to have a high resistance to vibration and shock.

Accordingly, it is an object of this invention to provide a hermetically sealed semiconductor device with an extremely simple structure.

A further object of the invention is to provide a semiconductor device of the type described which can be made by simple manufacturing processes.

Another object of the invention is to provide a hermetically sealed semiconductor device which is light in weight and has miniature dimensions.

Still another object of the invention is to provide a hermetically sealed semiconductor device with mechanical strength and resistance to vibration and shock.

Yet another object of the invention is to provide a low cost hermetically sealed semiconductor device suitable for mass production.

All of the objects, features and advantages of this invention and the manner of attaining them will become more apparent and the invention itself will be best understood by reference to the following description of an embodiment of the invention taken in conjunction with the accompanying drawing, in which.

The present invention is best suited for use in recently developed semiconductor integrated circuits of the type which have multiple lateral leads. The semiconductor device in accordance with the invention is hermetically sealed with low melting point glass in a housing comprising a cap and header on which a semiconductor element is attached with the necessary electrical connections provided, the header comprising glass, devitroceramic or similar insulating base material and a base ribbon which is made from a suitable metal sheet. The unit is assembled and is formed into a unitary structure by a heating process.

Figure 1:
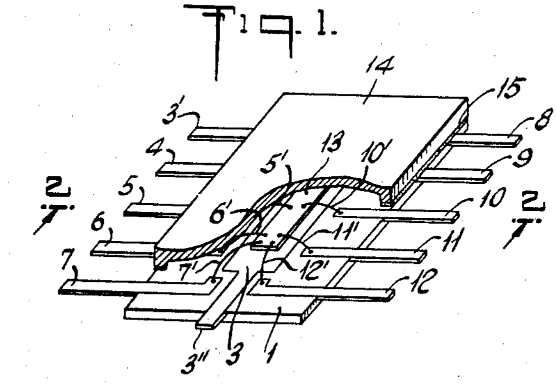
FIG. 1 is a view, shown partly broken away, of a semiconductor device of the hermetically sealed type made in accordance with this invention.
Figure 2:
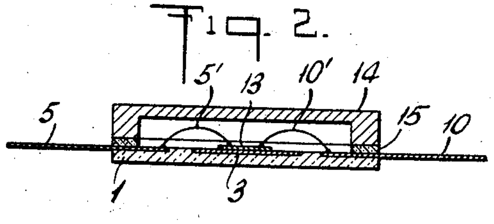
FIG. 2 is a cross section taken along the line 2—2 of the semiconductor device shown in FIG. 1.
Figure 3:
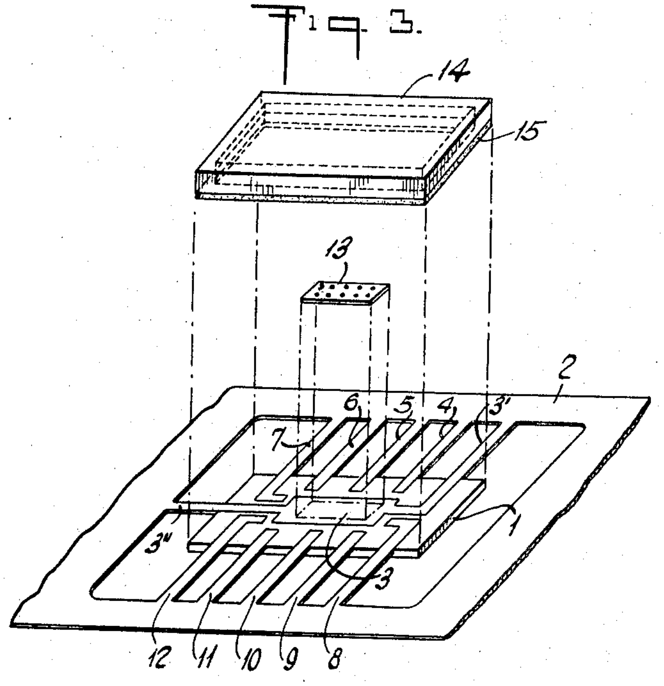
FIG. 3 is an exploded view showing parts of the semiconductor device of the invention.

Referring now to FIGS. 1, 2 and 3, and especially to FIG. 1, there is provided a header base 1 of glass, and which may also be devitroceramic or similar insulating material, or a ceramic plate or metal plate glazed on at least one side. A metal plate 3 having fingers 3′, and 3″, and lead fingers 4, 5, 6, 7, 8, 9, 10, 11 and 12 are brought into contact with the header base 1 at a temperature above the softening point of the glass, thereby forming the header. The metal plate 3 and fingers 3′, 3″, 4, 5, 6, 7, 8, 9, 10, 11 and 12 are attached to the glass surface of the header base 1 so firmly that it is advantageous to assemble the semiconductor element on the header. The semiconductor device is assembled by suitably attaching a semiconductor element 13 to the metal plate 3 and making the necessary electrical connections between each of the electrodes of the element 13 and each of the lead fingers 3′, 4, 5, 6, 7, 8, 9, 10, 11 and 12 with internal lead wires 4′, 5′, 6′, 7′, 8′ 9′, 10′, 11′ and 12′, the lead wires, 4′, 8′ and 9′ being hidden under the cap means 14 and therefore not seen in the drawing.

The cap means 14 is composed of glass, but may also be made of ceramic or metal, and is provided with a glazed periphery 15. This glazed periphery 15 is of a glass composition that softens below 500° C. and adheres to another substance easily. The cap means 14 is assembled with the header 1, the glazed periphery 15 facing the surface of the header and surrounding the semiconductor element 13. The assembly then is heated to a temperature where the glazed periphery 15 softens, thereby sealing in the element 13, producing a hermetically sealed semiconductor device. The desired hermetic seal may also be achieved with a low melting point glass tablet preformed to a suitable shape or with a low melting glass powder or frit, wherein the low melting point glass is heated to produce the hermetic seal.

Certain details of the construction of FIG. 1 are more clearly seen in the cross-sectional view of FIG. 2. In FIG. 3 the cap means 14 and the semiconductor element 13 are shown unassembled to illustrate further details of the invention. In FIG. 3 there is also seen a lead frame 2 of metal which is preformed, punched or photoengraved, for example, and having gold plated lead fingers 3′, 3″, 4, 5, 6, 7, 8, 9, 10, 11, 12 and the metal plate 3 of predetermined dimensions. The metal frame 2 is preferably, but not necessarily, of a composition comprising an alloy of approximately 48% iron and 52% nickel. The surface of the lead frame 2 is buried in the glass plate 1 or in the glazed layer which may be provided as described above. Such a structure may be obtained, for example, by heating in an inactive atmosphere at 860° C. the glass header base 1 with the lead frame 2 having a weight thereon, these being assembled in a jig which is of a material that does not adhere to glass. The glass base 1 should be at the bottom, the glass surface facing on the lead frame 2 and the weight providing sufficient pressure on the frame 2. After the semiconductor element is attached with the necessary electrical connection made and the unit is hermetically sealed, the lead frame is cut out and the device is completed.

As described above, the present invention provides the advantages of a thinner structure having a lighter weight and smaller dimensions than the conventional semiconductor devices, as well as considerable simplification in the structure and in the manufacturing method. Additionally, the invention provides the features of stability and low cost for complicated devices such as semiconductor integrated circuits.

Although a specific structure is disclosed in the embodiment described herein, it will be understood that the embodiment is for purposes of clarifying the disclosure and is not to be interpreted as any limitation on the scope of the present invention. It will therefore also be understood that the teachings herein are applicable within the scope of the invention to semiconductor devices of various types besides integrated circuits.

What is claimed is:

1. A semiconductor device comprising:
a stem base having at least one surface thereof made of insulating material,
a plurality of metallic leads in ribbon form protruding from said stem base,
one end of each protruding metallic lead being fused and bonded to said surface of said stem base in such a manner as to make the surface of each metallic lead substantially flush with said surface,
a metallic plate of the same material as said leads also bonded to said one surface with the surface thereof substantially flush with said one surface,
at least one semiconductor element mounted on said metallic plate at a position close to the bonded part of said plurality of metallic leads,
wiring means for providing electrical continuity between said semiconductor element and said plurality of metallic leads,
and means for hermetically sealing said metallic plate, said semiconductor element, said wiring means, and the part of said plurality of metallic leads which surrounds the location of said semiconductor element within a housing by use of a low metling point glass.

2. A semiconductor device comprising:
a base member of electrically insulating material selected from the group consisting of glass and devitroceramic,
a plurality of leads protruding from said base member,
a metallic plate of the same material as said leads,
said leads and said metallic plate being bonded to said base member and being substantially flush with one surface thereof,
a semiconductor element mounted on said metallic plate,
means for electrically connecting said semiconductor element and said leads,
a sealing cap for cooperating with said base member to define a housing for enclosing said semiconductor element,
and a continuous region of sealing material between said cap and said base member for hermetically sealing said semiconductor element in said housing, said sealing material comprising a low melting point glass,
and said melting point being lower than the melting point of said base member material and of said sealing cap.

3. The invention described in claim 2, wherein said sealing material comprises a peripheral band of glass formed on said sealing cap before said cap is assembled to said base member.

4. The invention described in claim 2, wherein said low softening point glass softens below the region of approximately 500° C.

5. A semiconductor device comprising:
a base member of electrically insulating material and having a surface selected from the group consisting of glass and devitroceramic,
a plurality of leads protruding from said base member,
said leads being bonded to said base member and being substantially flush with said surface,
a semiconductor element mounted on a metallic member,
said metallic member being of the same material as said leads and also being substantially flush with said surface,
means for electrically connecting said semiconductor element to said leads,
a sealing cap for cooperating with said base member to define a housing for enclosing said semiconductor element,
and a continuous region of sealing material between said cap and said base member for hermetically sealing said semiconductor element in said housing,
said sealing material comprising a low softening point glass.

References Cited

UNITED STATES PATENTS

| | | | |
|---|---|---|---|
| 3,072,832 | 1/1963 | Kilby | 317—235 |
| 3,199,003 | 8/1965 | Turner | 317—235 |
| 3,220,095 | 11/1965 | Smith | 29—155.5 |
| 3,239,719 | 3/1966 | Shower | 317—101 |
| 3,271,625 | 9/1966 | Caracciolo | 317—101 |
| 3,264,712 | 8/1966 | Hayashi et al. | 29—155.5 |
| 3,335,336 | 8/1966 | Urishida et al. | 317—234 |
| 3,340,347 | 9/1967 | Spiegler | 317—234 X |
| 3,341,649 | 9/1967 | James | 317—234 X |

JOHN W. HUCKERT, *Primary Examiner.*

R. F. POLISSACK, *Assistant Examiner.*